United States Patent
Pan et al.

(10) Patent No.: US 7,045,384 B1
(45) Date of Patent: May 16, 2006

(54) METHOD FOR DETERMINING METAL WORK FUNCTION BY FORMATION OF SCHOTTKY DIODES WITH SHADOW MASK

(75) Inventors: James N. Pan, Santa Clara, CA (US); Christy Mei-Chu Woo, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/614,031

(22) Filed: Jul. 8, 2003

(51) Int. Cl.
*H01L 21/00* (2006.01)

(52) U.S. Cl. .......................... 438/105; 438/16

(58) Field of Classification Search ................ 359/299; 313/503; 438/149, 167, 171, 178, 379, 393, 438/394, 396, 399, 571, 652, 669, 670, 674, 438/381, 570, 580–583, 597, 598, 655–656, 438/671, 943, 945–947; 324/634, 158.1; 427/84
See application file for complete search history.

(56) References Cited

U.S. PATENT DOCUMENTS

| | | | | |
|---|---|---|---|---|
| 4,782,302 A | * | 11/1988 | Bastasz et al. | 324/71.3 |
| 5,159,486 A | * | 10/1992 | Webb | 359/299 |
| 5,219,769 A | * | 6/1993 | Yonehara et al. | 438/105 |
| 5,608,287 A | * | 3/1997 | Hung et al. | 313/503 |
| 6,903,433 B1 | * | 6/2005 | McFarland et al. | 257/471 |

OTHER PUBLICATIONS

Characteristices of Al/p-CuAgINSe Polycrystalline Thin Film Schottky Barrier Diodes; G Venkata Rao; Mar. 6, 2001Thin Film Laboratory, Department of Physics, Sri Venkateswara University; pp. 571-576.*

* cited by examiner

*Primary Examiner*—Michael Lebentritt
*Assistant Examiner*—Andre' C. Stevenson

(57) ABSTRACT

A method of determining a work function of a metal to be used as a metal gate material provides a metal-on-silicon (MS) Schottky diode on a silicon substrate. The MS Schottky diode is formed by deposition of the metal in a single step deposition through a shadow mask that is secured on the silicon substrate.

18 Claims, 3 Drawing Sheets

METHOD FOR DETERMINING METAL WORK FUNCTION BY FORMATION OF SCHOTTKY DIODES WITH SHADOW MASK

FIELD OF THE INVENTION

The present invention relates to the field of semiconductor processing, and more particularly, to the determination of the work function of metal gates.

BACKGROUND OF THE INVENTION

In the integrated circuit (IC) industry, metal-oxide-semiconductor (MOS) transistors have typically been formed utilizing polysilicon gate electrodes. Polysilicon material has been preferred for use as a MOS gate electrode due to its thermal resistive properties (i.e., polysilicon can better withstand subsequent high temperature processing). Polysilicon's robustness during high temperature processing allows polysilicon to be annealed at high temperatures along with the source and drain regions. Furthermore, polysilicon's ability to block the ion implantation of doped atoms into a channel region is advantageous. Due to the ion implantation blocking potential of polysilicon, polysilicon allows for the easy formation of self-aligned source and drain structures after gate patterning is completed.

However, polysilicon gate electrodes have certain disadvantages. For example, polysilicon gate electrodes are formed from semiconductor materials that have higher resistivities than most metal materials. Therefore, polysilicon gate electrodes may operate at much slower speeds than gates made of metallic materials. To partially compensate for this higher resistance, polysilicon materials often require extensive and expensive silicide processing in order to increase their speed of operation to acceptable levels.

A need exists in the industry for a metal gate device which can replace a polysilicon gate device. However, metal gates cannot withstand the higher temperatures and oxidation ambient that can be withstood by conventional polysilicon gate electrodes. In efforts to avoid some of the concerns with polysilicon gate electrodes, a replacement damascene metal gate process has been created. A damascene gate process uses a disposable gate, which is formed along with a source, a drain, spacers, etch stops and anti-reflective coatings as in conventional processing. The disposable gate and dielectric are etched away, exposing an original gate oxide. The disposable polysilicon gate is then replaced by a metal gate to achieve the lower resistivity provided by the metal material.

A design consideration in semiconductor technology is that of the work function, which is the amount of energy required to excite electrons across a threshold. Polysilicon gates on silicon substrates provide a work function that allows the gates to be adequately controlled. The use of metal, however, as the gate material on the silicon substrate normally undesirably changes the work function in comparison to polysilicon gates. This reduces the controllability of the gate.

Metal gate materials for MOSFET designs are largely chosen based upon their metal work function. The advantages of metal gates include the elimination of the polysilicon depletion effects, which become worse with shorter transistor gate lengths, and the tunability of the work function. By contrast, with a polysilicon gate, the threshold voltage can only be adjusted by threshold implants. With CMOS created for sub-65 nm technologies, however, too much threshold adjustment implant may cause adverse effects and degrade the transistor performance. The metal gate technologies, with tunable work functions, provide a solution for this problem.

A number of different candidates exist for the metal gate materials. It is desirable to provide a simple and fast method of screening the potential metal gate materials by determining their metal work function. A Schottky diode has been employed in the past to measure the MOS-CV curve to thereby determine the metal work function of the metal materials. These Schottky diodes were formed by employing traditional lithography, metal deposition and etch processing steps. The Schottky diodes were metal-on-oxide-on-silicon diodes. The formation of Schottky diodes by this traditional method is relatively expensive and time-consuming. This is a disadvantage when it is desirable to screen a large number of potential metal gate materials.

SUMMARY OF THE INVENTION

There is a need for a method of screening potential metal gate materials that is economical and relatively fast.

These and other needs are met by embodiments of the present invention which provide a method of determining the work function of a metal comprising the steps of forming a metal-on-silicon (MS) Schottky diode with a metal having a work function to be determined forming contacts of the (MS) Schottky diode. A capacitance-voltage curve of the (MS) Schottky diode is measured. The work function of the metal is determined based on the measured capacitance-voltage curve. In certain embodiments of the invention, a shadow mask with repeating patterns is employed. Thin film metal is deposited selectively in the cutout portions of the shadow mask to create the (MS) Schottky diodes. The use of a shadow mask with repeating patterns with formation of metal-on-silicon Schottky diodes avoids the traditional lithography, metal deposition and etch processing steps. Instead, the (MS) Schottky diodes can be built on blanket silicon wafers with a single metal deposition, reducing the time and expense needed to determine the work function of candidate materials for metal gates.

The earlier stated needs are also met by embodiments of the present invention which provide a method of forming Schottky diodes for determining the work function of a metal. This method comprises the steps of positioning a shadow mask having holes on a silicon substrate. Metal is deposited through the holes in the shadow mask onto the silicon substrate. The holes include at least a first hole with a first cross-sectional area and a second hole with a second cross-sectional area that is at least 100 times greater than the first cross-sectional area.

The larger hole allows a substantially larger front contact to be provided on the front of a wafer. Since the front contact pattern is sufficiently larger than the metal area of the capacitor formed through the first hole, the effect of the front contact capacitance can be minimized during the measurement of the capacitance of the actual capacitor formed by the metal deposited through the first hole.

The foregoing and other features, aspects and advantages of the present invention will become more apparent from the following detailed description of the present invention when taken in conjunction with the accompany drawings.

DETAILED DESCRIPTION OF THE INVENTION

The present invention addresses and solves problems related to the screening of potential metal gate materials for use in semiconductor devices. In particular, the traditional methods of forming Schottky diodes to measure metal work function employed conventional lithography, metal deposition and etch processing steps. The present invention avoids such steps by forming a metal deposition on blanket silicon wafers with a metal gate material whose work function is to be determined. This is accomplished by the use of a shadow mask having specified repeating patterns. The metal-on-silicon formed by the deposition of metal through the holes in the shadow mask create a Schottky diode. By measurement of the capacitance-voltage curve of the Schottky diode, the work function of the metal can be determined.

Figure 1:
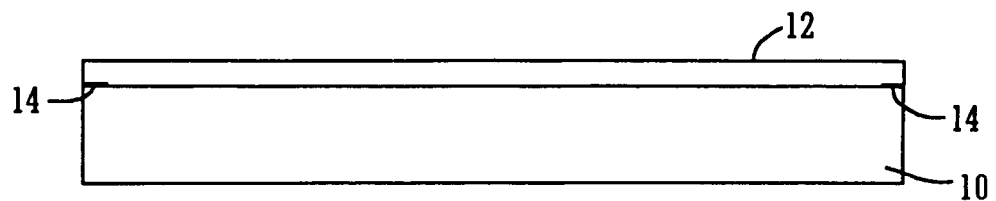
FIG. 1 is a cross-section of a substrate with a shadow mask, constructed in accordance with embodiments of the present invention, attached to the substrate.

FIG. 1 schematically depicts an arrangement for preparing a Schottky diode to determine a metal work function in accordance with embodiments of the present invention. A silicon wafer substrate 10 has a shadow mask 12 secured onto the top of the substrate 10. The shadow mask 12 may be made of a stainless steel (304), for example. Shadow mask 12 can be secured by heat resistant adhesion tape 14, or by other means, for example.

Figure 2:
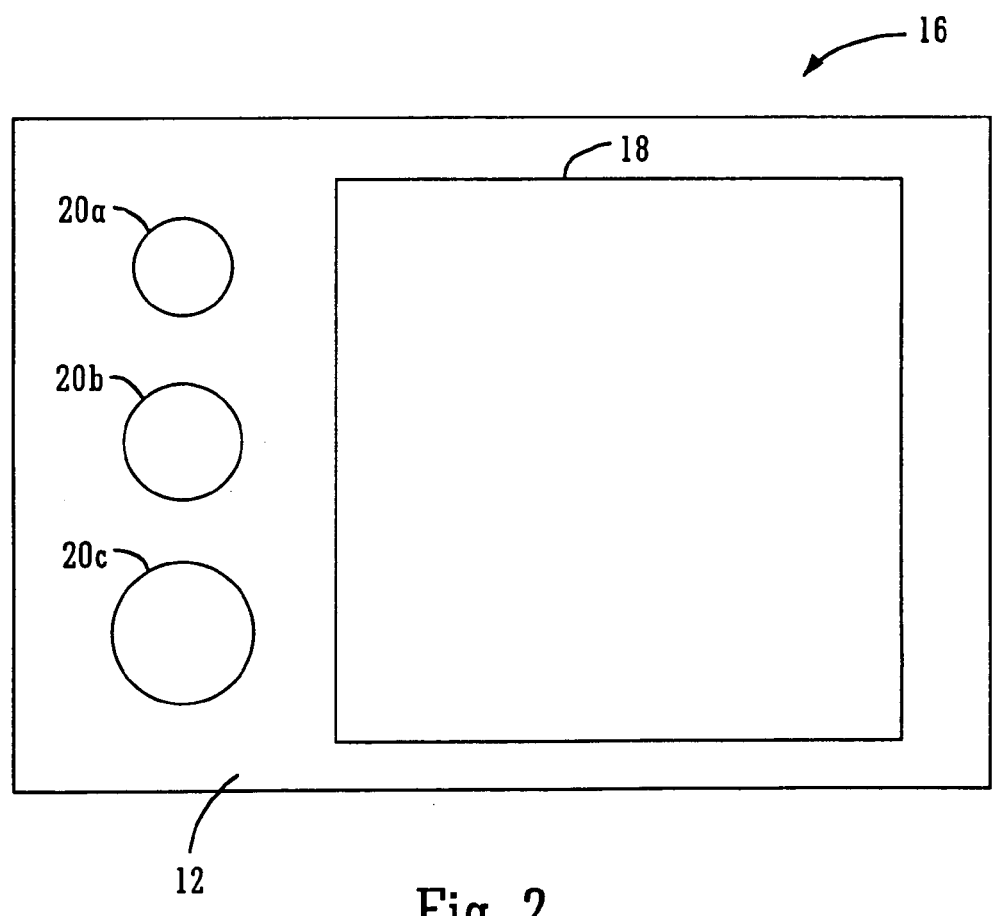
FIG. 2 shows a single pattern from the mask of FIG. 1, in accordance with embodiments of the present invention.

FIG. 2 depicts a pattern 16 of the shadow mask 12. Pattern 16 is repeated on the shadow mask 12 a number of times so that after the deposition, a number of metal contacts will be created.

Pattern 16 has a number of cutouts or holes. Each pattern includes a relatively large hole 18, termed the front contact hole 18, and a plurality of actual capacitor holes 20. The actual capacitor holes 20 are differently sized from one another and therefore referred to as 20A, 20B, 20C to distinguish the different sized holes. In an exemplary embodiment of the invention, the front contact hole 18 is approximately 0.5 in on each side or 0.25 in$^2$ in area. The actual capacitor holes 20A–20C are not shown to scale, but are rather much smaller than depicted in FIG. 2 in preferred embodiments. For example, actual capacitor hole 20A has a diameter of 0.01 in, actual capacitor hole 20B as a diameter of 0.015 in, and actual capacitor hole 20C has a diameter of 0.02 in. in certain preferred embodiments. Each of the actual capacitor holes 20A–20C are separated by a certain distance from the front contact hole 18. In certain embodiments of the invention, the separation is by the same amount as the diameter of that specific actual capacitor hole 20. For example, actual capacitor hole 20A is separated by a distance of 0.01 in from the front contact hole 18 in certain preferred embodiments of the invention.

The pattern 16 is exemplary only, as other patterns may be employed without departing from the scope of the present invention. However, the pattern 16 as provided allows for the formation of a relatively large front contact and a number of smaller actual capacitors. Once the metal is deposited, the large contact created by the deposition of the metal through front contact hole 18 provides a wafer-front contact for capacitance measurement. Without such a front contact, the bottom plate of the capacitor would have to be contacted from the backside of the wafer. However, films on the backside of a wafer can affect the CV measurement, as will the large substrate series resistance and backside contact resistance.

Although the pattern 16 is not drawn to scale, it is to be clearly understood that the size of the front contact hole 18 is much greater in preferred embodiments of the invention than the actual capacitor holes 20A–20C. In certain embodiments of the invention, the front contact hole 18 is at least 10 times greater in size than any of the actual capacitor holes 20A–20C. In certain other embodiments of the invention, the front contact hole 18 is at least 100 times greater than the actual capacitor holes 20A–20C. And in still further embodiments of the invention, the front contact hole is approximately 800 times greater in size or more than the size of the actual capacitor holes 20A–20C.

The provision of a front contact pattern that is much larger than the metal area of the actual capacitor allows the effect of the front contact capacitance to be minimized, as illustrated by the following equation: $1/C_m = 1/C_a + 1/C_{fc}$, where $C_m$ is the measured capacitance, $C_a$ is the actual capacitance, and $C_{fc}$ is the front contact capacitance. In the exemplary embodiment, the front contact capacitance is approximately 800 times larger than the actual capacitance, which makes the measured capacitance essentially equal to the actual capacitance at high frequencies (e.g., 100 KHz to 1 MHz). When the measurement is made of capacitance, the actual capacitance of the different size circles formed through the actual capacitor holes 20A–20C may be measured. The provision of three circles of small, medium and large diameter sizes respectively provides a number of degrees of freedom for device characterization, and extrapolating to calculate effective capacitor areas and substrate doping concentrations.

Figure 3:
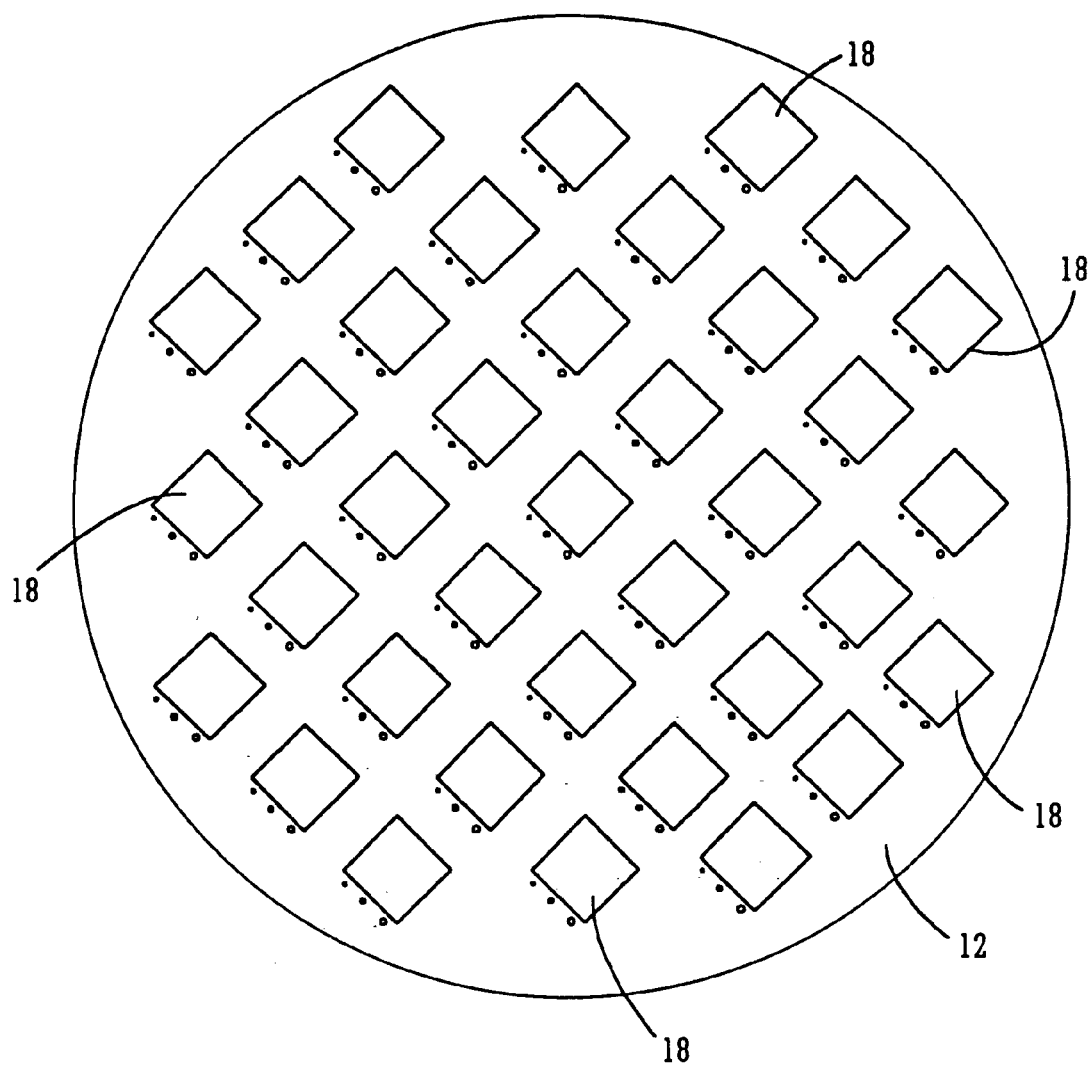
FIG. 3 is a top view of the shadow mask in accordance with embodiments of the present invention.

FIG. 3 depicts a top view of a shadow mask 12 having repeating patterns, such as pattern 16, mounted on a surface of the substrate 10. In this depiction, the actual capacitor holes 20A–20C are too small to be represented accurately in comparison to the front capacitor hole 18, and are thus not depicted. As can be seen from this drawing, the shadow mask 12 has a relatively large number of patterns 16.

Once the shadow mask 12 is secured in place, the conventional process may be employed to deposit the metal. For example, sputter depositing by physical vapor deposition may be employed. The metal will be deposited on the silicon substrate only through the front contact holes 18 and the actual capacitor holes 20A–20C (not shown in FIG. 3). Some metal may be deposited around the circumference of the shadow mask 12 onto the silicon substrate 10.

Figure 4:
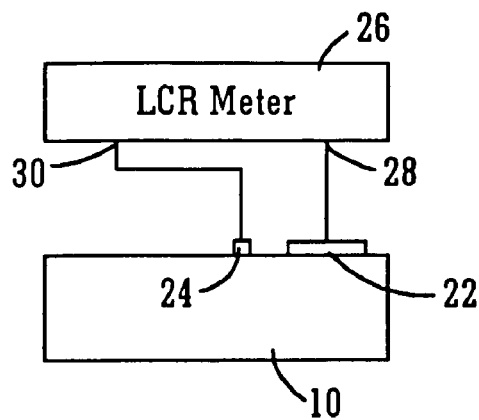
FIG. 4 schematically depicts a wafer following deposition of the metal and removal of the shadow mask, connected to an LCR meter for determining the metal work function of the deposited metal, in accordance with embodiments of the present invention.
Figure 5:
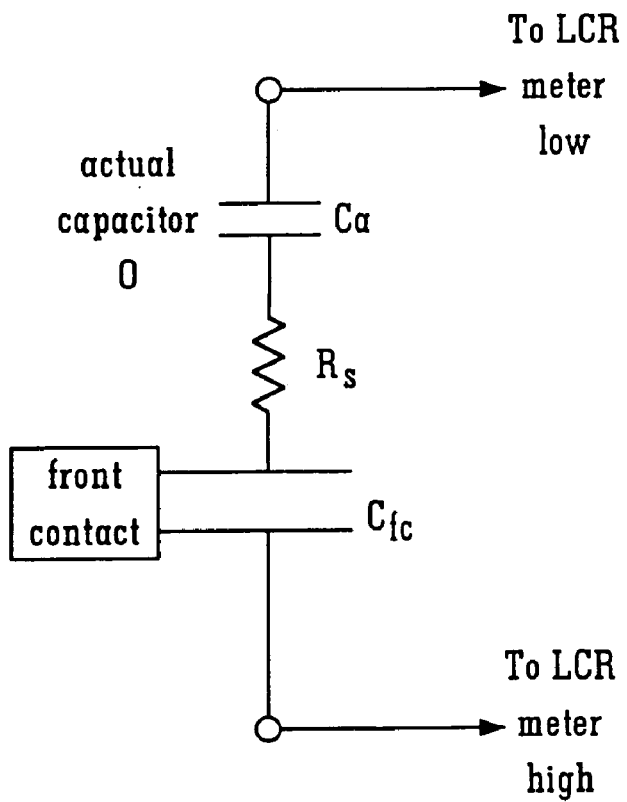
FIG. 5 shows an equivalent RC circuit of the structure formed by the embodiments of the present invention.

FIG. 4 depicts the substrate 10 upon which the metal has been deposited and the shadow mask 12 removed. Only a single set of contacts is depicted in order not to obscure the invention, although the deposition process and repeating patterns 16 of the shadow mask 12 will produce a large number of contacts on the substrate 10. As seen in cross-section, the substrate 10 has a larger front contact 22 and smaller actual capacitors 24 (only one of which is shown in FIG. 4). A meter for measuring the capacitance and voltage, such as a HP4284 LCR meter, is referenced as numeral 26 in FIG. 4. In the exemplary embodiment, the LCR meter 26 has high and low probes, with the high probe 28 of the LCR meter connected to the larger, front contact metal 22. The low probe 30 of the LCR meter 26 is in contact with the smaller, actual capacitor 24. The polarity may be reversed to improve the accuracy of the CV measurement, as the LCR high probe 28 provides more accuracy when it contacts a larger piece of metal, such as the front contact 22. The space between the metal contacts 24, 22 is the series resistance ($R_s$) which can be extrapolated by the LCR meter with either a $C_s$-$R_s$ or $C_p$-$R_p$ mode. An equivalent schematic RC circuit is shown in FIG. 5.

With the present invention, formation of Schottky diodes by the deposition of metal on the silicon substrate may be performed in a rapid manner, reducing time needed to determine the work function of a candidate metal gate material as well as reducing the expenses associated with determining the work function. A number of different metal gate material candidates may therefore be tested in a cost-effective and rapid manner.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of determining a work function of a metal, comprising the steps of:
   forming a metal-on-silicon (MS) Schottky diode with a metal having a work function to be determined forming contacts of the MS Schottky diode;
   measuring a capacitance-voltage curve of the MS Schottky diode; and
   determining the work function of the metal based on the measured capacitance-voltage curve.

2. The method of claim 1, wherein the step of forming the MS Schottky diode includes depositing the metal on a silicon substrate in accordance with a mask on the silicon substrate.

3. The method of claim 2, wherein the mask is a shadow mask.

4. The method of claim 2, wherein a first one of the contacts is at least ten times smaller in size than a second one of the contacts.

5. The method of claim 4, wherein the step of measuring a capacitance voltage curve includes contacting the first and second contacts with respective probes of an LCR meter.

6. The method of claim 5, wherein the first and second contacts are on the same side of the silicon substrate.

7. The method of claim 6, wherein the first contact is at least 100 times smaller in size than the second contact.

8. The method of claim 7, wherein the first contact is at least 800 times smaller in size than the second contact.

9. The method of claim 2, wherein a plurality of the contacts are actual capacitor contacts and another one of the contacts is a front contact.

10. The method of claim 9, wherein the actual capacitor contacts are different sizes from one another.

11. The method of claim 10, wherein each of the actual capacitor contacts have a size that is at least 100 times smaller than the front contact.

12. A method of forming Schottky diodes for determining work function of a metal, comprising the steps of:
    positioning a shadow mask having holes on a silicon substrate; and
    depositing the metal through holes in the shadow mask into the silicon substrate, the holes including at least a first hole with a first cross-sectional area and a second hole with a second cross-sectional area that is at least 100 times greater than the first cross-sectional area.

13. The method of claim 12, wherein the holes in the shadow mask are in sets of a repeating pattern.

14. The method of claim 13, wherein each pattern includes actual capacitor holes and a front contact hole, the front contact hole being the second hole, and the actual capacitor holes being the first holes.

15. The method of claim 14, wherein the actual capacitor holes within each one of the patterns are different sizes from one another.

16. The method of claim 15, wherein each of the actual capacitor holes within each pattern is at least 100 times smaller than the front contact holes.

17. The method of claim 16, wherein the front contact hole is approximately 0.25 in$^2$.

18. The method of claim 17, wherein a first one of the actual capacitor holes is approximately 0.02 inches in diameter, a second one of the actual capacitor holes is approximately 0.015 inches in diameter, and a third one of the actual capacitor holes is approximately 0.010 inches in diameter.

* * * * *